United States Patent
Koizumi

(10) Patent No.: US 6,240,145 B1
(45) Date of Patent: May 29, 2001

(54) APPARATUS FOR RECEIVING DATA

(75) Inventor: Fumiaki Koizumi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/092,104

(22) Filed: Jun. 5, 1998

(30) Foreign Application Priority Data

Jun. 6, 1997 (JP) ................................... 9-149657

(51) Int. Cl.[7] .............................. H03D 1/00; H04L 27/06
(52) U.S. Cl. ...................... 375/341; 375/262; 714/794; 714/795
(58) Field of Search .................................. 375/341, 262, 375/265; 714/792, 794, 795

(56) References Cited

U.S. PATENT DOCUMENTS 5,644,603 * 7/1997 Ushirokawa ........................ 375/341

FOREIGN PATENT DOCUMENTS

| 97/24849 | 7/1997 | (EP) . |
|---|---|---|
| 2252221 | 7/1992 | (GB) . |
| 63-166332 | 7/1988 | (JP) . |
| 0615347 | 9/1994 | (WO) . |
| 0691770 | 1/1996 | (WO) . |

OTHER PUBLICATIONS

Guren, et al., *IEEE*, "Decision Feedback Sequence Estimation for Continous Phase Modulation on a Linear Multipath Channel", vol. 41, No. 2, Feb. 1993, pp. 280–284.

* cited by examiner

*Primary Examiner*—Chi Pham
*Assistant Examiner*—Jean B. Corrielus
(74) *Attorney, Agent, or Firm*—Ostrolenk, Faber, Gerb & Soffen, LLP

(57) ABSTRACT

In outputting the decision results of decoding of a received signal by the maximum likelihood serial estimation using Viterbi algorithm, a channel estimation section estimates the channel state. The magnitude and delay quantity of delay wave contained in the received signal are determined, by a control section for the number of states, from the channel state estimated by the channel estimation section to determine the necessary number of states in Viterbi decoding, and decoding is controlled by the number of states. A viterbi decoder carries out the decoding according to the control based on the number of states determined by the control section for the number of states. By virtue of this constitution, when the transmission quality of the channel is good, the quantity of computation in the Viterbi decoder is reduced to reduce the power consumption and, at the same time, the quantity of the computation is minimized to realize high speed processing.

6 Claims, 3 Drawing Sheets

APPARATUS FOR RECEIVING DATA

FIELD OF THE INVENTION

The invention relates to an apparatus for receiving data, and more particularly to an apparatus for receiving data that is applied to a portable radio telephone and the like and carries out decoding while following a time variation based on the characteristics of a channel of a radio circuit and the like.

BACKGROUND OF THE INVENTION

Conventional apparatuses for receiving data applied to portable telephones include, for example, "Data Receiver" disclosed in Japanese Patent Laid-Open No. 166332/1988. According to the conventional apparatus for receiving data, the path memory length of a Viterbi decoder is varied depending upon the channel state. Specifically, the path memory length of the Viterbi decoder is varied depending upon the quality of the channel, and, when the quality of the channel is good, the delay within the Viterbi decoder is reduced to improve the transmission efficiency.

In the conventional apparatus for receiving data, however, the number of states in the Viterbi decoder is not taken into consideration, and, even when the transmission quality of the channel is good, the number of states is used which matches the average channel state. In other words, even when the transmission quality of the channel is good, the computation quantity of the Viterbi decoder cannot be reduced, resulting in increased power consumption, and, at the same time, the computation quantity cannot be minimized, unfavorably making it impossible to conduct high speed processing.

SUMMARY OF THE INVENTION

Accordingly, it is an object of the invention to provide an apparatus for receiving data that, when the transmission quality of the channel is good, can reduce the quantity of computation in the Viterbi decoder to reduce the power consumption and, at the same time, can minimize the quantity of computation to realize high speed processing.

According to the invention, an apparatus for receiving data, adapted for outputting data of decoding decision results of a received signal by maximum likelihood serial estimation using Viterbi algorithm, comprises decoding means for specifying the number of states in Viterbi algorithm to an assigned value and carrying out decoding based on the control of the determined Viterbi algorithm.

In the preferred embodiment, the decoding means comprises:

channel estimation means for estimating the state of channel;

control means for the number of states which, based on the channel state estimated by the channel estimation means, determines the magnitude and delay quantity of delay wave contained in the received signal to determine the number of states of predetermined Viterbi decoding and, based on the number of states, controls the decoding; and Viterbi decoding means for carrying out decoding according to the control based on the number of states determined by the control means for the number of states.

In the preferred embodiment, the Viterbi decoding means comprises:

a branch metric generating section which calculates and generates branch metric with necessary number of states from the control means for the number of states using an input signal and an impulse response estimation value as estimation of the channel state by the channel estimation means;

a computing section which adds the path metric from the preceding time period within each of the number of states to the branch metric from the branch metric generating section to determine the path metric at the current time for the necessary number of states, sends the path metric selected as a survival path which is the largest path metric in two paths created in each time, and sends information on survival path;

a path memory which receives information on the survival path from the computing section to renew a transition record on a memory; and a maximum likelihood decision section which compares the size of path metric of the information on the survival path from the computing section, selects path memory series corresponding to the maximum path metric from the path memory, withdraws the oldest data recorded in the data series, and sends the oldest data as output decoded data.

In the preferred embodiment, the estimation of the channel state in the channel estimation means is carried out by estimation of the impulse response of the channel.

In the preferred embodiment, the apparatus is applied to a portable radio telephone.

According to the apparatus, for receiving data, having the above construction, data of decision results of decoding of a received signal are output by maximum likelihood serial estimation using Viterbi algorithm. The number of states in the Viterbi algorithm is specified to any assigned value, and decoding is carried out based on the control of the determined Viterbi algorithm.

Consequently, unlike the prior art, the number of states, which matches the average channel state, is not used when the transmission quality of the channel is good. That is, when the transmission quality of the channel is good, the quantity of computation in the Viterbi decoder is reduced to reduce the power consumption and, at the same time, the quantity of computation can be minimized to realize high speed processing.

BRIEF DESCRIPTION OF THE DRAWINGS

The invention will be explained in more detail in conjunction with appended drawings, wherein.

DESCRIPTION OF THE PREFERRED EMBODIMENTS

Before explaining an apparatus for receiving data in the preferred embodiment according to the invention, the aforementioned conventional apparatus for receiving data will be explained in more detail in FIG. 1.

Figure 1:
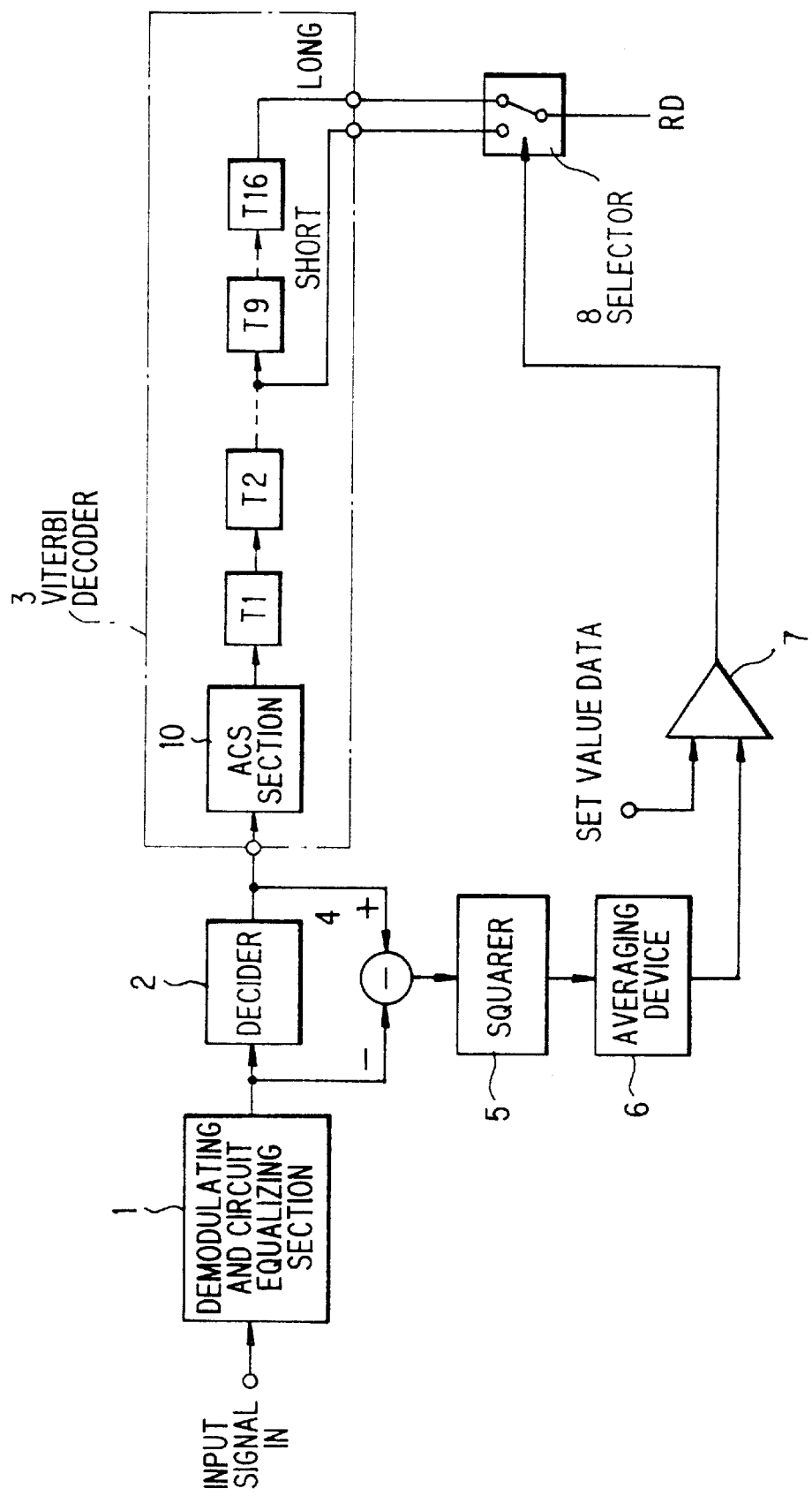
FIG. 1 is a block diagram showing the construction of a conventional data receiver.

FIG. 1 shows the construction of the conventional apparatus for receiving data.

In this apparatus for receiving data, an input signal IN with a trellis code as an error correcting code added thereto is input through a channel. The input signal IN is input into a demodulating and circuit equalizing section 1 where demodulation is carried out and a demodulated signal subjected to characteristic equalization is input into a decider 2 and a subtracter 4. The decider 2 compares a high (H) level or a low (L) level of the analog demodulated signal with a threshold to make a decision. As a result, the analog demodulated signal is converted to digital demodulated data which then enters a Viterbi decoder 3.

In the Viterbi decoder 3, the digital demodulated data are input into an ACS section 10 as a computing unit. A signal output from the ACS section 10 is input into path memories T1, T2 ... T9 ... T16 for 16 symbols, followed by decoding using a trellis code.

On the other hand, a signal output from the decider 2 and a signal output from the demodulating and circuit equalizing section 1 are input into the substracter 4, where the output signal from the demodulating and circuit equalizing section 1 is subtracted from the output signal from the decider 2 and the resultant error signal is output. The larger the error signal, the larger the deformation of the waveform of the input signal IN, that is, the lower the quality of the transmission in the channel.

The error signal from the subtracter 4 is squared and averaged respectively by a squarer 5 and an averaging device 6, and the error power is input into a comparator 7. In the comparator 7, the error power is compared with the set value, and the comparison signal is sent to a selector 8 to switch a moving contact. Into two fixed contacts of the selector 8 are fed data on decoding results after 8 symbols (SHORT) and data on decoding results after 16 symbols (LONG) in path memories T1 to T16 in the Viterbi decoder 3.

When, as a result of the comparison in the comparator 7, the error power from the averaging device 6 immediately before the end of the initial training sequence is larger than the set value, the selector 8 selects the data of decoding results after 16 symbols (LONG) in the path memories T1 to T16 in the Viterbi decoder 3 to perform processing for enhancing the error correction in the Viterbi decoder 3.

On the other hand, when the error power is smaller than the set value, the selector 8 selects the data of decoding results after 8 symbols (SHORT) reduce the internal delay. Thus, the length of path memories T1 to T16 in the Viterbi decoder 3 is varied according to the transmission quality in the channel to reduce the internal delay in the Viterbi decoder 3.

Next, an apparatus for receiving data in the preferred embodiment according to the invention will be explained in more detail in FIG. 2.

This apparatus for receiving data comprises: a Viterbi decoder 20 which permits an input signal IN to be fed and sends output decoded data by decoding described below; and a channel estimation section 22 which permits the input signal IN to be fed and estimates the channel state, that is, estimates the impulse response of the channel.

The apparatus for receiving data further comprises a control section 23 for the number of states that determines the magnitude (level) and the quantity of delay time of delay wave contained in the input signal IN from the impulse response of n taps estimated by the channel estimation section 22 and, in addition, performs control for determining the number of states in the Viterbi decoder 20 for equalizing the delay wave. In the control section 23 for the number of states, for example, when the delay wave to be equalized amounts to 4 symbols, the number of states necessary for the equalization is 16 (the 4th power of 2). This is sent as the necessary number of states to the Viterbi decoder 20.

The Viterbi decoder 20 comprises: a branch metric generating section 24 which calculates and generates branch metric, for the necessary number of states determined by the control section 23 for the number of states, using the input signal IN and an impulse response estimation value; and an ACS section 25 as a computing unit. The ACS section 25 adds path metric from the preceding time period within each of the number of states and the branch metric received from the branch metric generating section 24 to determine path metric at the current time for the necessary number of states, sends, to a maximum likelihood decision section 27, the path metric selected as a survival path which is the largest path metric in two paths created in each time, and sends information on survival path to a path memory 26.

The Viterbi decoder 20 further comprises a path memory 26 which, upon receipt of the information of survival path from the ACS section 25, renews a transition record on the memory; and a maximum likelihood decision section 27 which compares the size of path metric in the information on the survival path from the ACS section 25, selects path memory series corresponding to the maximum path metric from the path memory 26, withdraws the oldest data recorded in the data series, and sends the oldest data as output decoded data.

Next, the operation of the preferred embodiment will be explained.

Figure 2:
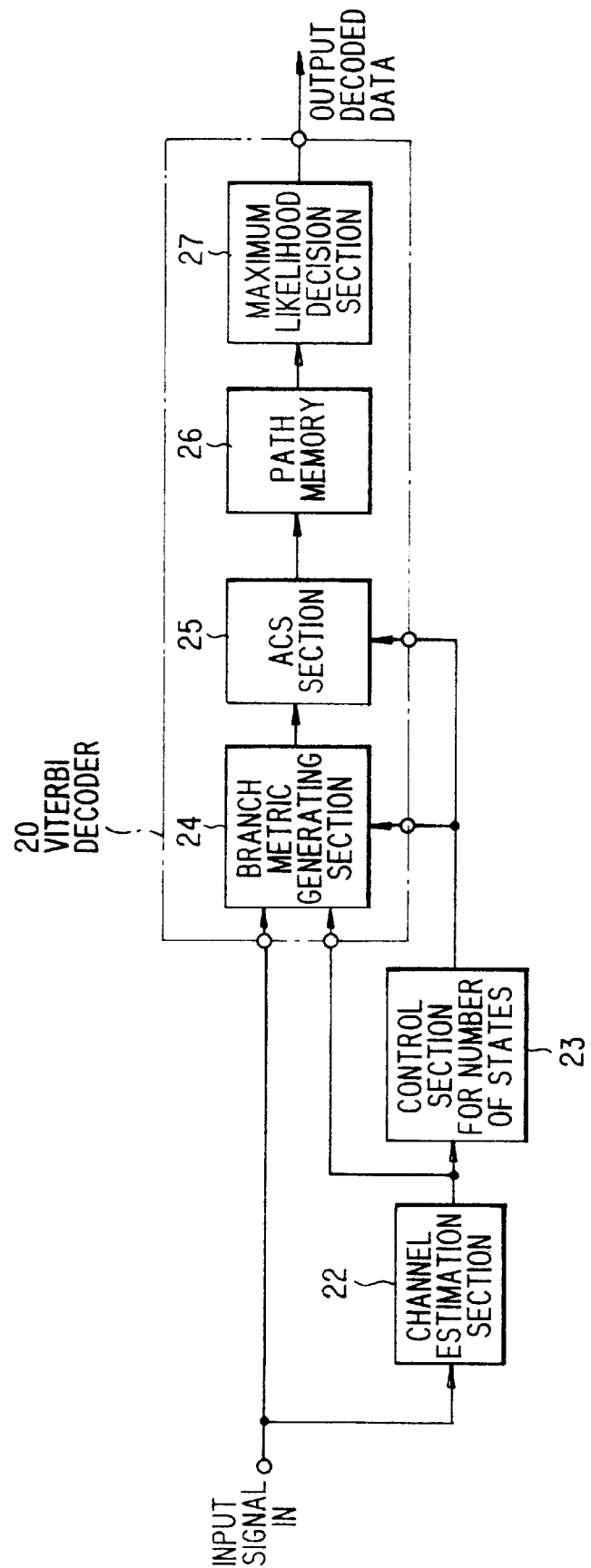
FIG. 2 is a block diagram showing the construction of the apparatus for receiving data according to a preferred embodiment of the invention.

In FIG. 2, the input signal IN is input into the Viterbi decoder 20 and the channel estimation section 22. The channel estimation section 22 estimates the channel state received from the input signal IN to estimate the impulse response of the channel.

Next, the control section 23 for the number of states determines the magnitude and the quantity of delay time of delay wave contained in the input signal from the impulse response of n taps estimated by the channel estimation section 22, and determines the number of states in the Viterbi decoder 20 for equalizing the delay wave. Further, for example, when the delay wave to be equalized amounts to 4 symbols, the number of states necessary for the equalization, i.e., 16 (the 4th power of 2), is sent as the necessary number of states to the Viterbi decoder 20.

In the Viterbi decoder 20, the branch metric generating section 24 calculates the branch metric of the necessary number of states, received from the control section 23 for the number of states, based on the input signal IN and the estimated value of the impulse response received from the channel estimation section 22.

The ACS section 25 adds the path metric from the preceding time period within each of the number of states to the branch metric received from the branch metric generating section 24 to determine the path metric at the current time for the necessary number of states. The path metric which is the largest path metric in two paths created in each time is selected as a survival path, and this path metric is sent to the maximum likelihood decision section 27 which will be described later. In addition, information on the survival path is sent to the path memory 26.

Further, in the Viterbi decoder 20, as soon as the path memory 26 receives the information on the survival path from the ACS section 25, the transition record on the memory is renewed. At the same time, the maximum likelihood decision section 27 compares the size of the path metric in the information on the survival path received from the ACS section 25, selects path memory series corresponding to the maximum path metric from the path memory 26, withdraws the oldest data recorded in the data series, and sends the oldest data as output decoded data.

Next, the setting of the necessary number of states will be explained.

Figure 3:
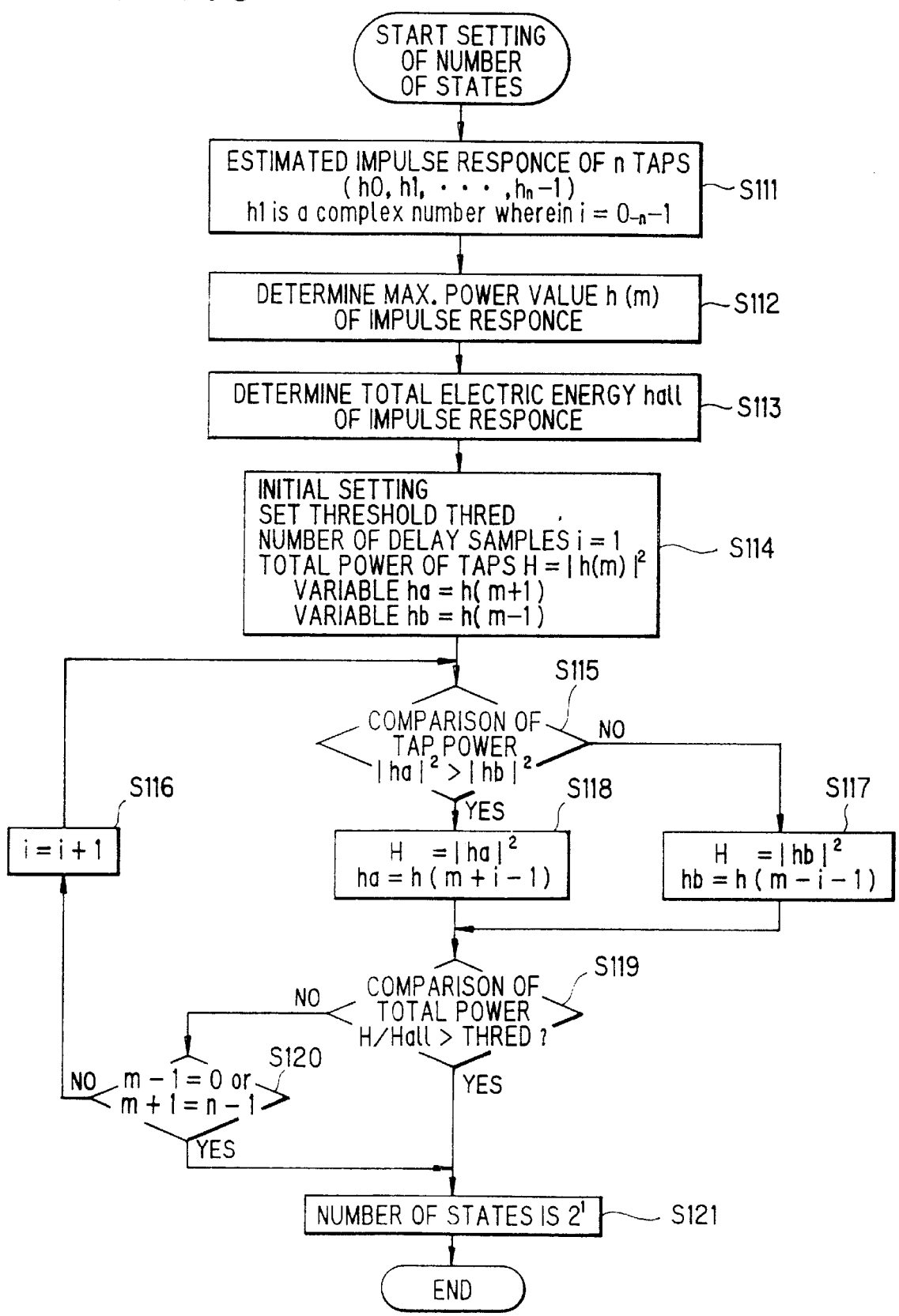
FIG. 3 is a flow chart showing the procedure for setting the necessary number of states according to a preferred embodiment of the invention.

FIG. 3 is a flow chart showing the procedure for setting the necessary number of states.

In FIG. 3, at the outset, the channel impulse response of n taps estimated by the channel estimation section 22 is processed.

In this case, n can be regarded as the estimatable "number of delay samples−1." The impulse response is a complex number (step S111). Next, a tap h (m) (wherein m represents the position in the impulse response of n taps) having the maximum likelihood power in the impulse response of n taps is determined (step S112).

The total power (hall) of the impulse response of n taps is determined (step S113). Initial setting is carried out for calculation. Here the initial value of the number of delay samples i for the determination of the finally necessary number of states would be presumed to be "1." Further, the threshold THRED is determined. The threshold THRED is the ratio H of the total tap power H to the total power (hall) of the impulse response.

The set threshold THRED indicates the magnitude of the total power of j taps smaller than the n taps in relation with the total power of the impulse response which permits the delay wave to be decided to be "j−1." Here the initial value of the total tap power H would be presumed to be h (m). Further, taps before and after the maximum value h (m) determined in step S112 are substituted for ha and hb (step S114).

Comparison of the tap power is carried out. The powers of the taps, taps ha and hb, before and after the maximum value h (m) are compared with each other. In the initial loop, the level of the tap power before the maximum value h (m) is compared with the level of the tap power after the maximum value h (m). The tap values respectively before and after the impulse response of the tap i for which the total tap power H has been calculated are always substituted for the taps ha and hb. That is, when these large and small values are determined, it is possible to determine which tap power, the tap power before the maximum value or the tap power after the maximum value, should be added to the total tap power H (step S115).

In this case, when the power of the tap ha is larger, the power of the tap ha is added to the total tap power H, followed by substitution of h(m+i+1) for the tap ha. In the initial loop, h(m+2) is substituted (step S118). The power of the tap hb is added to the total tap power H, and h(m−i−1) is substituted for the tap hb. In the initial loop, h(m−2) is substituted (step S117).

By the processing up to this stage, the total power of the maximum power tap and the tap having larger power selected from taps respectively before and after the maximum power tap, i+1 taps, is provided as the total tap power H. In the initial loop, the total power of the maximum power tap and the tap having larger power selected from taps respectively before and after the maximum power tap is provided.

Next, whether the ratio of the total tap power H to the total power (hall) of the impulse response is larger than the set threshold THRED is determined (step S119). In this case, when the ratio is larger than the set threshold THRED, in the total tap power H satisfactorily close to the total power (hall) of the impulse response, the number of delay samples i is used as the delay wave number, and the necessary number of states is specified to the ith power of 2 (step S121). On the other hand, in step S119, when the ratio does not exceed the set threshold THRED, whether m+i is n−1 or m−i is 0 is confirmed.

This step is carried out for avoiding the processing of taps with the impulse response being absent in the increment in the tap i in the next step (step S120). When the above processing is correct, the processing after that is stopped and the number of states is determined with the tap i as such being used as the delay wave number (step S121).

When m+i is not n−1 or m−i is not 0, the tap i is incremented (step S116), followed by returning to the step of comparing the tap power (step S115).

As is apparent from the foregoing description, according to the apparatus for receiving data, the channel state is estimated, the magnitude and delay quantity of delay wave contained in a received signal are determined from the channel state to determine the necessary number of states in Viterbi decoding, and decoding is carried out based on the number of states.

As a result, when the transmission quality of the channel is good, the quantity of computation in the Viterbi decoder can be reduced to reduce the power consumption and, at the same time, the quantity of computation can be minimized to realize high speed processing.

The invention has been described in detail with particular reference to preferred embodiments, but it will be understood that variations and modifications can be effected within the scope of the present invention as set forth in the appended claims.

What is claims is:

1. An apparatus for receiving data and outputting decoded data by maximum likelihood serial estimation, said apparatus comprising:

a channel estimation means which estimates the state of a channel of an input signal;

a control means which determines a magnitude and delay quantity of a delay wave contained in the input signal based on the estimated state of the channel so as to determine a number of states of a predetermined Viterbi decoding and controls the decoding based on the number of states determined; and a Viterbi decoding means which performs decoding according to the number of states determined by the control means.

2. The apparatus according to claim 1, wherein the Viterbi decoding means comprises:

a branch metric generating section which calculates and generates branch metric for each of the number of states determined by the control means using the input signal and an impulse response estimation value output by the channel estimation means;

a computing section which adds a path metric from a preceding time period within each of the number of states to the branch metric generated by the branch metric generating section so as to determine current time path metrics for each of the number of states, selects survival path information from each of the current time path metrics based on a largest path metric from two current time path metrics determined for different states, and outputs said survival path information;

a path memory which receives said survival path information and renews a transition record to form a data series; and a maximum likelihood decision section which compares the path metric of the survival path information, selects a path memory series corresponding to the larger path metric from the path memory transition record, withdraws the oldest data recorded in the data series which corresponds to the larger path metric from the transition record, and outputs the oldest data as output decoded data.

3. The apparatus according to claim 1, wherein the estimation of the channel state in the channel estimation means is carried out by estimation of the impulse response of the channel.

4. The apparatus according to claim 1, wherein the apparatus is applied to a portable radio telephone.

5. An apparatus for receiving data and outputting decoded data by maximum likelihood serial estimation comprising:

a channel estimator which receives an input signal having a delay wave and estimates a channel state of said input signal;

a control section which determines a necessary number of states in viterbi decoding based on a magnitude and delay quantity of said delay wave as determined from said estimated channel state; and a viterbi decoder which performs decoding according to the necessary number of states determined by the control section.

6. A method for receiving data and outputting decoded data by maximum likelihood serial estimation comprising the steps of:

receiving an input signal having a delay wave;

estimating a channel state of said input signal;

determining a necessary number of states in viterbi decoding based on a magnitude and delay quantity of said delay wave as determined from said estimated channel state; and performing decoding according to the necessary number of states determined.

* * * * *